United States Patent
Fujii et al.

(10) Patent No.: US 11,115,743 B2
(45) Date of Patent: Sep. 7, 2021

(54) SIGNAL PROCESSING DEVICE, SIGNAL PROCESSING METHOD, AND PROGRAM

(71) Applicant: JVCKENWOOD CORPORATION, Yokohama (JP)

(72) Inventors: Yumi Fujii, Yokohama (JP); Takahiro Gejo, Yokohama (JP); Hisako Murata, Yokohama (JP); Masaya Konishi, Yokohama (JP); Kuniaki Takachi, Yokohama (JP)

(73) Assignee: JVCKENWOOD Corporation, Yokohama (JP)

( * ) Notice: Subject to any disclaimer, the term of this patent is extended or adjusted under 35 U.S.C. 154(b) by 0 days.

(21) Appl. No.: 16/816,765

(22) Filed: Mar. 12, 2020

(65) Prior Publication Data

US 2020/0213702 A1      Jul. 2, 2020

Related U.S. Application Data

(63) Continuation of application No. PCT/JP2018/034548, filed on Sep. 19, 2018.

(30) Foreign Application Priority Data

Sep. 26, 2017    (JP) .............................. JP2017-184622

(51) Int. Cl.
*H04R 1/10* (2006.01)
*H03G 3/30* (2006.01)
*H04R 3/02* (2006.01)
*H04R 3/04* (2006.01)
*H04R 5/033* (2006.01)
*H04S 1/00* (2006.01)
*H04S 7/00* (2006.01)

(52) U.S. Cl.
CPC .............. *H04R 1/10* (2013.01); *H03G 3/3005* (2013.01); *H04R 3/02* (2013.01); *H04R 3/04* (2013.01); *H04R 5/033* (2013.01); *H04S 1/00* (2013.01); *H04S 7/00* (2013.01)

(58) Field of Classification Search
None
See application file for complete search history.

(56) References Cited

U.S. PATENT DOCUMENTS

| | | |
|---|---|---|
| 2009/0208027 A1 | 8/2009 | Fukuda et al. |
| 2015/0010158 A1* | 1/2015 | Broadley ......... G10K 11/17881 381/58 |
| 2015/0358715 A1* | 12/2015 | Macours .................. H04R 5/04 381/74 |

FOREIGN PATENT DOCUMENTS

JP          2009-194769 A      8/2009

* cited by examiner

*Primary Examiner* — Kenny H Truong
(74) *Attorney, Agent, or Firm* — Procopio, Cory, Hargreaves & Savitch LLP

(57) ABSTRACT

A signal processing device according to an embodiment includes a measurement signal generation unit that generates a first measurement signal and outputs the signal to headphones, a sound pickup signal acquisition unit that acquires a first sound pickup signal obtained by picking up the first measurement signal by a microphone, a signal analysis unit that calculates a frequency response of the first sound pickup signal, a fit determination unit that determine a fit of the headphones by comparing a response value of the frequency response in a specified frequency band with a reference value, and a display unit that outputs gradual results of the determination in accordance with a percentage of the response value with respect to the reference value.

5 Claims, 10 Drawing Sheets

SIGNAL PROCESSING DEVICE, SIGNAL PROCESSING METHOD, AND PROGRAM

CROSS REFERENCE TO RELATED APPLICATION

This application is a Bypass Continuation of International Application No. PCT/JP2018/034548 filed on Sep. 19, 2018, which is based upon and claims the benefit of priority from Japanese patent application No. 2017-184622 filed on Sep. 26, 2017, the disclosure of which is incorporated herein in its entirety by reference.

BACKGROUND

The present disclosure relates to a signal processing device, a signal processing method, and a program.

Patent Literature 1 (Japanese Unexamined Patent Application Publication No. 2009-194769) discloses an ear canal resonance correction device including an inverse filter generation means that creates an inverse filter of an ear canal model. In the device disclosed in Patent Literature 1, earphones or headphones output sound source signals, and microphones placed in the ear canals pick up sound signals. In accordance with the resonance frequency obtained from the frequency response of the sound signals, a delay time of a delay device is calculated. The ear canal model is created based on the delay time of the delay device.

SUMMARY

When a user wears headphones or earphones to measure sound signals as disclosed in Patent Literature 1, it is important that the user is wearing the headphones or earphones appropriately. If measurement is carried out in the state where the user is not wearing the headphones or earphones appropriately, accurate measurement cannot be achieved, which makes it impossible to acquire sound pickup signals suitable for creation of an inverse filter.

Particularly, as a high-capacity, small-size and high-speed storage device has been widespread with smartphones recently, it has become possible to perform measurement on a user at home. When a user performs measurement for him/herself, it is not possible to objectively determine whether the user is wearing headphones or earphones appropriately. Thus, there is a possibility of measuring signals without wearing headphones or earphones appropriately. It is therefore desirable to appropriately measure signals with headphones or earphones worn.

The present embodiment has been accomplished to solve the above problems and an object of the present disclosure is thus to provide a signal processing device, a signal processing method and a program capable of appropriately measuring signals from headphones or earphones worn by a user.

A signal processing device according to an embodiment includes a measurement signal generation unit configured to generate a first measurement signal and output the signal to headphones or earphones, a sound pickup signal acquisition unit configured to acquire a first sound pickup signal obtained by picking up the first measurement signal by a microphone, a signal analysis unit configured to calculate a frequency response of the first sound pickup signal, a fit determination unit configured to determine a fit of the headphones or earphones by comparing a response value of the frequency response in a specified frequency band with a reference value, and an output unit configured to output gradual results of the determination in accordance with a percentage of the response value with respect to the reference value.

A signal processing method according to an embodiment includes a step of generating a first measurement signal and outputting the signal to headphones or earphones, a step of acquiring a first sound pickup signal obtained by picking up the first measurement signal by a microphone, a step of calculating a frequency response of the first sound pickup signal, a step of determining a fit of the headphones or earphones by comparing a response value of the frequency response in a specified frequency band with a reference value, and a step of outputting gradual results of the determination in accordance with a percentage of the response value with respect to the reference value.

A program according to an embodiment causes a computer to execute a step of generating a first measurement signal and outputting the signal to headphones or earphones, a step of acquiring a first sound pickup signal obtained by picking up the first measurement signal by a microphone, a step of calculating a frequency response of the first sound pickup signal, a step of determining a fit of the headphones or earphones by comparing a response value of the frequency response in a specified frequency band with a reference value, and a step of outputting gradual results of the determination in accordance with a percentage of the response value with respect to the reference value.

DETAILED DESCRIPTION

The overview of a sound localization process using a filter generated by a signal processing device according to an embodiment is described hereinafter. An out-of-head localization process according to this embodiment performs out-of-head localization by using spatial acoustic transfer characteristics and ear canal transfer characteristics. The spatial acoustic transfer characteristics are transfer characteristics from a sound source such as speakers to the ear canal. The ear canal transfer characteristics are transfer characteristics from the entrance of the ear canal to the eardrum. In this embodiment, out-of-head localization is implemented by measuring the ear canal transfer characteristics when headphones or earphones are worn, and using those measurement data.

Out-of-head localization according to this embodiment is performed by a user terminal such as a personal computer, a smart phone, or a tablet PC. The user terminal is an information processor including a processing means such as a processor, a storage means such as a memory or a hard disk, a display means such as a liquid crystal monitor, and an input means such as a touch panel, a button, a keyboard and a mouse. The user terminal has a communication function to transmit and receive data. Further, an output means (output unit) with headphones or earphones is connected to the user terminal.

(Out-of-Head Localization Device)

Figure 1:
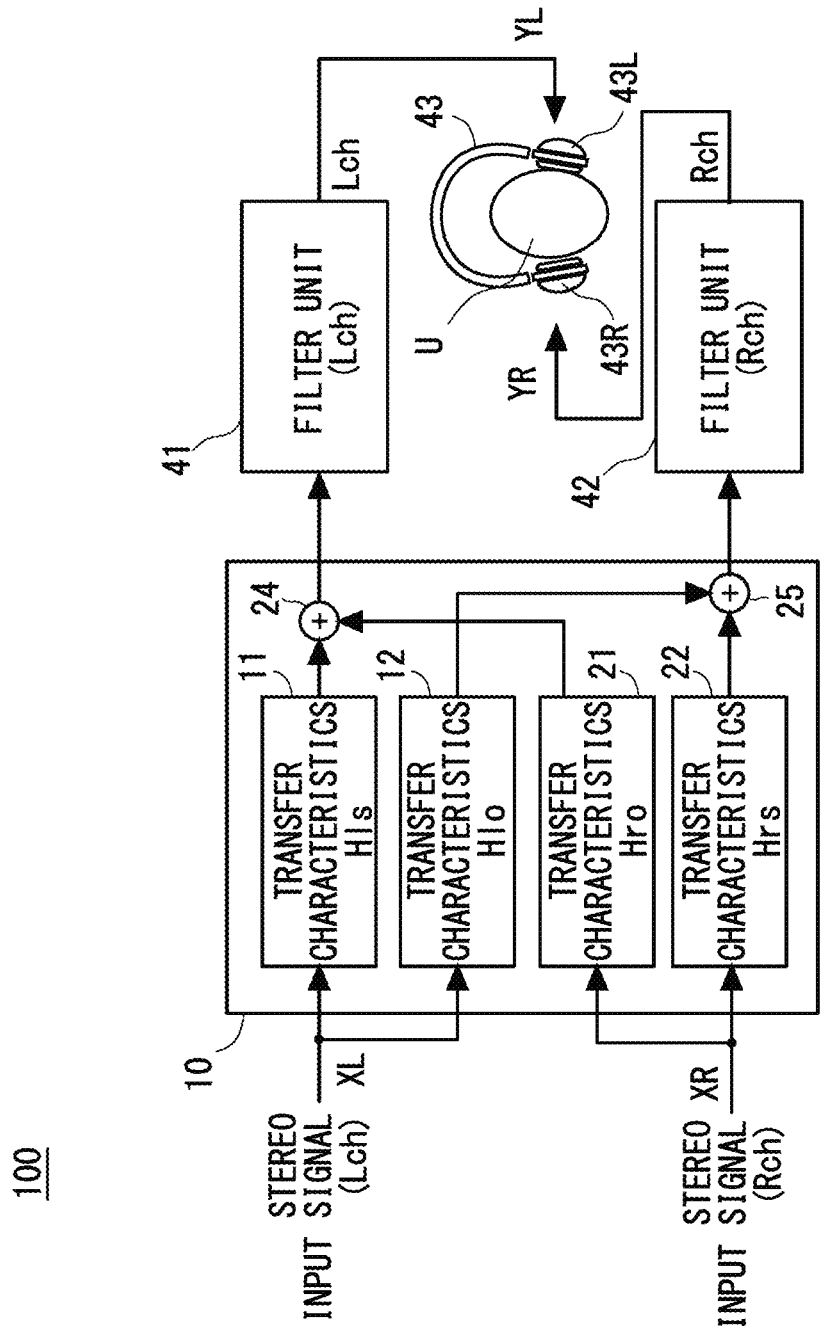
FIG. 1 is a block diagram showing an out-of-head localization device according to an embodiment.

FIG. 1 shows an out-of-head localization device 100, which is an example of a sound field reproduction device according to this embodiment. FIG. 1 is a block diagram of the out-of-head localization device 100. The out-of-head localization device 100 reproduces sound fields for a user U who is wearing the headphones 43. Thus, the out-of-head localization device 100 performs sound localization for L-ch and R-ch stereo input signals XL and XR. The L-ch and R-ch stereo input signals XL and XR are analog audio reproduced signals that are output from a CD (Compact Disc) player or the like or digital audio data such as mp3 (MPEG Audio Layer-3). Note that the out-of-head localization device 100 is not limited to a physically single device, and a part of processing may be performed in a different device. For example, a part of processing may be performed by a personal computer or the like, and the rest of processing may be performed by a DSP (Digital Signal Processor) included in the headphones 43 or the like.

The out-of-head localization device 100 includes an out-of-head localization unit 10, a filter unit 41, a filter unit 42, and the headphones 43. The out-of-head localization unit 10, the filter unit 41 and the filter unit 42 can be implemented by, to be specific, a processor or the like.

The out-of-head localization unit 10 includes convolution calculation units 11 to 12 and 21 to 22, and adders 24 and 25. The convolution calculation units 11 to 12 and 21 to 22 perform convolution processing using the spatial acoustic transfer characteristics. The stereo input signals XL and XR from a CD player or the like are input to the out-of-head localization unit 10. The spatial acoustic transfer characteristics are set to the out-of-head localization unit 10. The out-of-head localization unit 10 convolves a filter of the spatial acoustic transfer characteristics (which is referred hereinafter also as a spatial acoustic filter) into each of the stereo input signals XL and XR having the respective channels. The spatial acoustic transfer characteristics may be a head-related transfer function HRTF measured in the head or auricle of a measured person, or may be the head-related transfer function of a dummy head or a third person.

The spatial acoustic transfer characteristics are a set of four spatial acoustic transfer characteristics Hls, Hlo, Hro and Hrs. Data used for convolution in the convolution calculation units 11 to 12 and 21 to 22 is a spatial acoustic filter. The spatial acoustic filter is generated by cutting out the spatial acoustic transfer characteristics Hls, Hlo, Hro and Hrs with a specified filter length.

Each of the spatial acoustic transfer characteristics Hls, Hlo, Hro and Hrs is acquired in advance by impulse response measurement or the like. For example, the user U wears microphones on the left and right ears, respectively. Left and right speakers placed in front of the user U output impulse sounds for performing impulse response measurement. Then, the microphones pick up measurement signals such as the impulse sounds output from the speakers. The spatial acoustic transfer characteristics Hls, Hlo, Hro and Hrs are acquired based on sound pickup signals in the microphones. The spatial acoustic transfer characteristics Hls between the left speaker and the left microphone, the spatial acoustic transfer characteristics Hlo between the left speaker and the right microphone, the spatial acoustic transfer characteristics Hro between the right speaker and the left microphone, and the spatial acoustic transfer characteristics Hrs between the right speaker and the right microphone are measured.

Then, the convolution calculation unit 11 convolves the spatial acoustic filter in accordance with the spatial acoustic transfer characteristics Hls to the L-ch stereo input signal XL. The convolution calculation unit 11 outputs convolution calculation data to the adder 24. The convolution calculation unit 21 convolves the spatial acoustic filter in accordance with the spatial acoustic transfer characteristics Hro to the R-ch stereo input signal XR. The convolution calculation unit 21 outputs convolution calculation data to the adder 24. The adder 24 adds the two convolution calculation data and outputs the data to the filter unit 41.

The convolution calculation unit 12 convolves the spatial acoustic filter in accordance with the spatial acoustic transfer characteristics Hlo to the L-ch stereo input signal XL. The convolution calculation unit 12 outputs convolution calculation data to the adder 25. The convolution calculation unit 22 convolves the spatial acoustic filter in accordance with the spatial acoustic transfer characteristics Hrs to the R-ch stereo input signal XR. The convolution calculation unit 22 outputs convolution calculation data to the adder 25. The adder 25 adds the two convolution calculation data and outputs the data to the filter unit 42.

An inverse filter that cancels out the headphone characteristics (characteristics between a reproduction unit of headphones and a microphone) is set to the filter units 41 and 42. Then, the inverse filter is convolved to the reproduced signals (convolution calculation signals) on which processing in the out-of-head localization unit 10 has been performed. The filter unit 41 convolves the inverse filter of the L-ch headphone characteristics to the L-ch signal from the adder 24. Likewise, the filter unit 42 convolves the inverse filter of the R-ch headphone characteristics to the R-ch signal from the adder 25. The inverse filter cancels out the characteristics from the headphone unit to the microphone when the headphones 43 are worn. The microphone may be placed at any position between the entrance of the ear canal and the eardrum. The microphone is preferably placed at the same position as the wearing position when spatial acoustic transfer characteristics are measured. The inverse filter is calculated from a result of measuring the characteristics of the user U as described later.

The filter unit 41 outputs a corrected L-ch signal to a left unit 43L of the headphones 43. The filter unit 42 outputs a corrected R-ch signal to a right unit 43R of the headphones 43. The user U is wearing the headphones 43. The headphones 43 output the L-ch signal and the R-ch signal toward the user U. It is thereby possible to reproduce sound images localized outside the head of the user U.

As described above, the out-of-head localization device 100 performs out-of-head localization by using the spatial acoustic filters in accordance with the spatial acoustic transfer characteristics Hls, Hlo, Hro and Hrs and the inverse filters of the headphone characteristics. In the following description, the spatial acoustic filters in accordance with the spatial acoustic transfer characteristics Hls, Hlo, Hro and Hrs and the inverse filter of the headphone characteristics are referred to collectively as an out-of-head localization filter. In the case of 2ch stereo reproduced signals, the out-of-head localization filter is composed of four spatial acoustic filters and two inverse filters. The out-of-head localization device 100 then carries out convolution calculation on the stereo reproduced signals by using the total six out-of-head localization filters and thereby performs out-of-head localization.

(Measurement Device of Ear Canal Transfer Characteristics)

Figure 2:
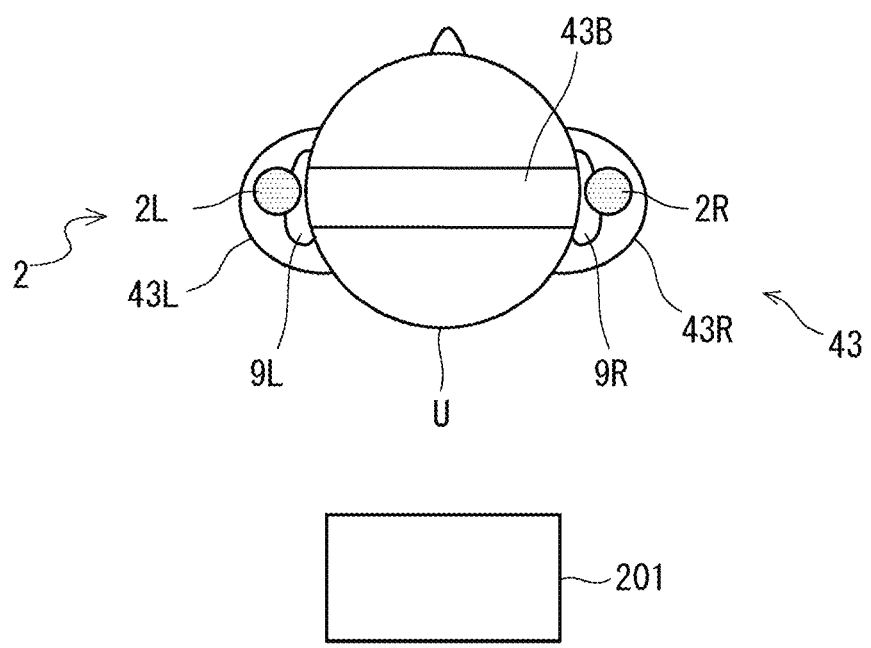
FIG. 2 is a view showing the structure of a measurement device for measuring ear canal transfer characteristics.

A measurement device 200 that measures the ear canal transfer characteristics to generate an inverse filter is described hereinafter with reference to FIG. 2. FIG. 2 shows the structure for measuring the transfer characteristics on a user U. The measurement device 200 includes a microphone unit 2, headphones 43, and a signal processing device 201.

The microphone unit 2 and the headphones 43 are connected to the signal processing device 201. The microphone unit 2 may be included in the headphones 43. The microphone unit 2 includes a left microphone 2L and a right microphone 2R. The left microphone 2L is worn on a left ear 9L of the user U. The right microphone 2R is worn on a right ear 9R of the user U. The signal processing device 201 may be the same processing device as or a different processing device from the out-of-head localization device 100. Earphones may be used instead of the headphones 43.

The headphones 43 include a headphone band 43B, a left unit 43L, and a right unit 43R. The headphone band 43B connects the left unit 43L and the right unit 43R. The left unit 43L outputs a sound toward the left ear 9L of the user U. The right unit 43R outputs a sound toward the right ear 9R of the user U. The type of the headphones 43 may be closed, open, semi-open, semi-closed or any other type. The headphones 43 are worn on the user U while the microphone unit 2 is worn on the user U. Specifically, the left unit 43L and the right unit 43R of the headphones 43 are worn on the left ear 9L and the right ear 9R on which the left microphone 2L and the right microphone 2R are worn, respectively. The headphone band 43B generates an urging force to press the left unit 43L and the right unit 43R against the left ear 9L and the right ear 9R, respectively.

The left microphone 2L picks up the sound output from the left unit 43L of the headphones 43. The right microphone 2R picks up the sound output from the right unit 43R of the headphones 43. A microphone part of each of the left microphone 2L and the right microphone 2R is placed at a sound pickup position near the external acoustic opening. The left microphone 2L and the right microphone 2R are formed not to interfere with the headphones 43. Specifically, the user U can wear the headphones 43 in the state where the left microphone 2L and the right microphone 2R are placed at appropriate positions of the left ear 9L and the right ear 9R, respectively.

The signal processing device 201 outputs measurement signals to the headphones 43. The headphones 43 thereby generate impulse sounds or the like. To be specific, an impulse sound output from the left unit 43L is measured by the left microphone 2L. An impulse sound output from the right unit 43R is measured by the right microphone 2R. The microphones 2L and 2R acquire sound pickup signals at the time of outputting the measurement signals, and thereby impulse response measurement is performed.

The signal processing device 201 stores the sound pickup signals acquired based on the impulse response measurement into a memory or the like. The transfer characteristics between the left unit 43L and the left microphone 2L (which is the ear canal transfer characteristics of the left ear) and the transfer characteristics between the right unit 43R and the right microphone 2R (which is the ear canal transfer characteristics of the right ear) are thereby acquired. The ear canal transfer characteristics of the left ear acquired by the left microphone 2L is referred to as Lch (left channel) ear canal transfer characteristics, and the ear canal transfer characteristics of the right ear acquired by the right microphone 2R is referred to as Rch (right channel) ear canal transfer characteristics. The signal processing device 201 cuts out measurement data of the transfer characteristics with a specified filter length and thereby calculates a filter factor.

The signal processing device 201 includes a memory or the like that stores measurement data of the transfer characteristics. Note that the signal processing device 201 generates an impulse signal, a TSP (Time Stretched Pulse) signal or the like as the measurement signal for measuring the ear canal transfer characteristics. The measurement signal contains a measurement sound such as an impulse sound.

Further, the signal processing device 201 determines whether the headphones 43 are a good fit or not. When the headphones 43 are not a good fit, the signal processing device 201 presents a display that prompts the user to adjust the headphones 43. It is thereby possible to measure signals in an appropriate state. For example, this prevents measurement from being performed in the state where the isolation of the headphones 34 is poor. This also prevents measurement from being performed without balance between left and right. It is thereby possible to measure more accurate ear canal transfer characteristics with stability.

Figure 3:
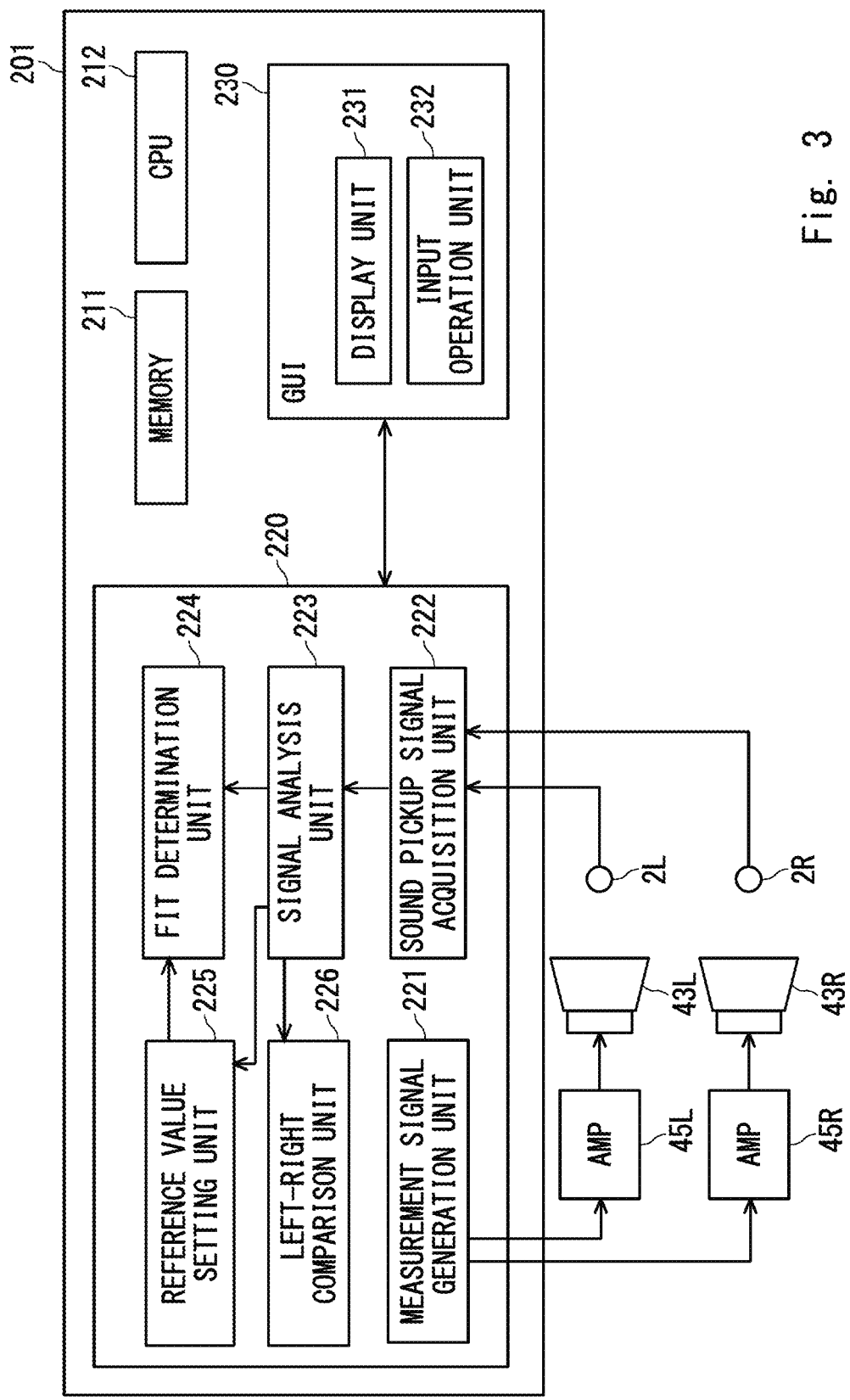
FIG. 3 is a control block diagram showing the structure of a signal processing device.

A process in the signal processing device 201 is described hereinafter in detail with reference to FIG. 3. FIG. 3 is a control block diagram showing the structure of the signal processing device 201. The signal processing device 201 includes a memory 211, a CPU (Central Processing Unit) 212, a measurement unit 220, and a GUI (Graphical User Interface) 230.

The measurement unit 220 includes a measurement signal generation unit 221, a sound pickup signal acquisition unit 222, a signal analysis unit 223, a fit determination unit 224, a reference value setting unit 225, and a left-right comparison unit 226. The GUI 230 is an input-output interface for the user U, and it includes a display unit 231 and an input operation unit 232.

The signal processing device 201 is an information processing device such as a personal computer or a smartphone, and it includes the memory 211 and the CPU 212. The memory 211 stores a processing program, parameters and the like. The CPU 212 executes the processing program stored in the memory 211. Processing in the measurement unit 220 and the GUI 230 is thereby performed.

The function of each block in the measurement unit 220 is implemented as a result that the CPU 212 executes a computer program. Specifically, the program in memory 211 is executed, and thereby the measurement signal generation unit 221, the sound pickup signal acquisition unit 222, the signal analysis unit 223, the fit determination unit 224, the reference value setting unit 225, and the left-right comparison unit 226 perform specified processing.

The measurement signal generation unit 221 generates a measurement signal. The measurement signal generated in the measurement signal generation unit 221 is amplified by amplifiers 45L and 45R and output to the headphones 43. The amplifiers 45L and 45R may be included in the signal processing device 201 or the headphones 43. Each of the left unit 43L and the right unit 43R outputs a measurement signal for measuring the transfer characteristics. Measurement of Lch and Rch is performed in the same manner by using the same measurement signal.

Each of the left microphone 2L and the right microphone 2R picks up the measurement signal, and outputs a sound pickup signal to the signal processing device 201. The sound pickup signal acquisition unit 222 acquires the sound pickup signals from the left microphone 2L and the right microphone 2R. Note that the sound pickup signal acquisition unit 222 includes an A/D converter, an amplifier and the like, and it may perform A/D conversion, amplification and the like of the sound pickup signals from the left microphone 2L and the right microphone 2R. Further, the sound pickup signal acquisition unit 222 may perform synchronous addition of the signals obtained by a plurality of measurements.

The signal analysis unit 223 analyzes the sound pickup signals acquired by the measurement signal generation unit 221. For example, the signal analysis unit 223 calculates spectrums in the frequency domain from the sound pickup signals in the time domain by FFT (fast Fourier transform). An amplitude response (amplitude spectrum) and a phase response (phase spectrum) of the sound pickup signals are thereby generated. Note that a power spectrum may be generated instead of the amplitude spectrum. The signal analysis unit 223 may transform the sound pickup signals into frequency domain data by discrete Fourier transform or discrete cosine transform.

Further, the signal analysis unit 223 extracts one or two or more response values from the amplitude response. The signal analysis unit 223 calculates the response value from the amplitude value in a specified frequency band. For example, the signal analysis unit 223 calculates the response value based on the amplitude response in the frequency band of 90 Hz to 1 kHz. Further, in the case where the signal analysis unit 223 sets a plurality of response values, the response values are set from the amplitude values in different frequency bands. For example, three response values are set in this embodiment. A first response value is set based on the amplitude value in a first band, and a second response value is set based on the amplitude value in a second band different from the first band. A third response value is set based on the amplitude value in a third band different from the first and second bands. By using a plurality of response values, it is possible to determine a fit more appropriately. Further, the response value may be the average of amplitude values in a specified frequency band, and it may be an amplitude value at one certain frequency.

The reference value setting unit 225 sets the amplitude response obtained by initialization as a reference response. In other words, a step of initialization, which is described later, is processing for obtaining the reference response. Note that the response value extracted from the reference response is a reference value. The reference value setting unit 225 stores the reference response or the reference value in the memory 211 or the like. A process of initialization is described later.

The fit determination unit 224 determines the fit of the headphones 43 on the user U. To be specific, the fit determination unit 224 compares the response value of the amplitude response obtained by user measurement with the reference value. Then, the fit determination unit 224 determines whether the fit is good or not good based on a result of comparison between the response value and the reference value. To be specific, when the response value exceeds the reference value, the fit determination unit 224 determines that the fit is good. On the other hand, when the response value falls below the reference value, the fit determination unit 224 determines that the fit is not good. When the fit is determined to be good, the signal processing device 201 performs ECTF measurement for obtaining the ear canal transfer characteristics.

The left-right comparison unit 226 compares measurement data of Lch ear canal transfer characteristics and measurement data of Rch ear canal transfer characteristics. Then, the left-right comparison unit 226 makes determination (error determination) whether a microphone wearing position is appropriate or not based on a result of comparing left and right channels. When there is a certain degree of difference between left and right transfer characteristics, the left-right comparison unit 226 determines that the microphone wearing position is erroneous. When it is determined to be erroneous, the microphone position is adjusted, and remeasurement is carried out.

The display unit 231 is an output unit having a display or the like. The display unit 231 displays a determination result in the fit determination unit 224 and an error determination result in the left-right comparison unit 226. The display unit 231 outputs gradual determination results in accordance with the percentage of the response value with respect to the reference value. Further, when the fit is not good, the display unit 231 presents a display that prompts the user to put on the headphones 43 again. It is thereby possible to measure the ear canal transfer characteristics in an appropriate fit. Further, when the left-right comparison unit 226 determines the result as erroneous, the display unit 231 presents a display that prompts the user to adjust the positions of the left microphone 2L and the right microphone 2R. It is thereby possible to create an inverse filter with a good balance between left and right.

Note that a determination result or the like may be output by sound or vibration. Specifically, an output unit that outputs a determination result may include the headphones 43, earphones, speakers and the like for outputting alarm sounds or the like, or may include an actuator that outputs vibrations.

The input operation unit 232 includes an input means such as a touch panel, a keyboard and a mouse, and receives an operation input from the user U.

Figure 4:
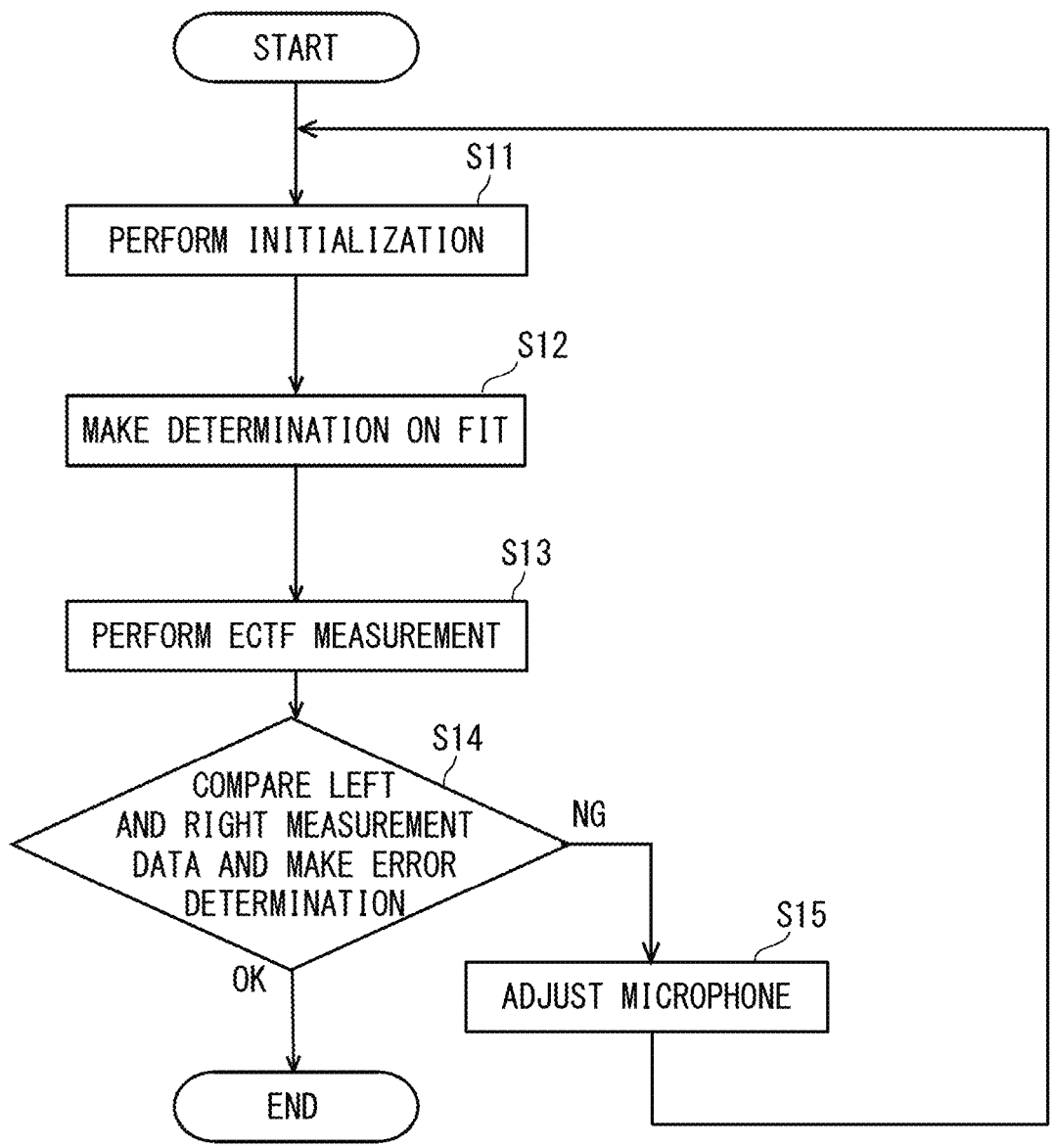
FIG. 4 is a flowchart showing a signal processing method in a signal processing device.

A measurement method by the measurement device 200 is described hereinafter with reference to FIG. 4. FIG. 4 is a flowchart showing the measurement method. When the user U carries out measurement by using the input operation unit 232, the measurement unit 220 performs initialization (S11). The reference response or the reference value is thereby set to the reference value setting unit 225.

Figure 5:
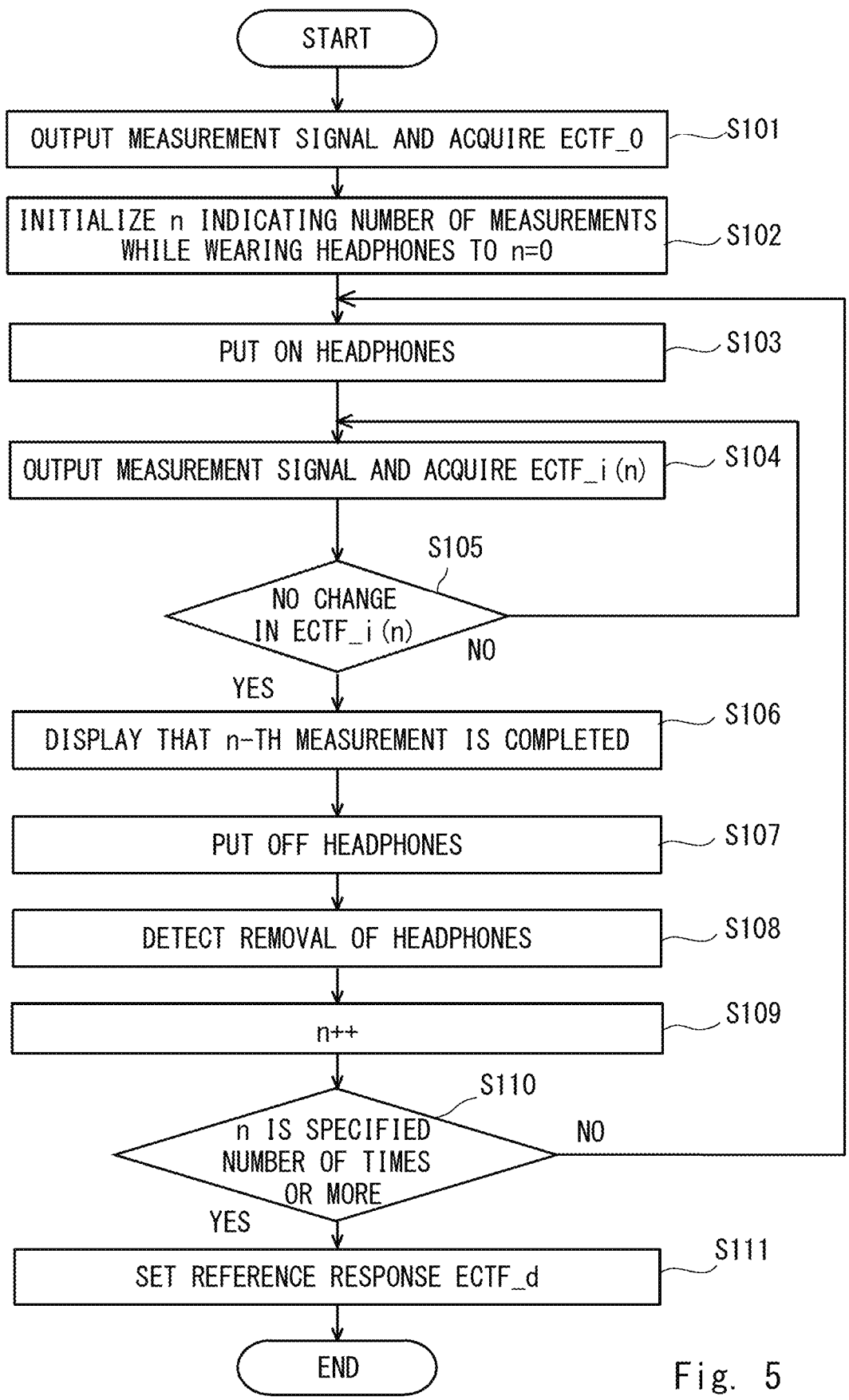
FIG. 5 is a flowchart showing a process of initialization.

A detailed flow of initialization for setting the reference response is described hereinafter with reference to FIG. 5. FIG. 5 is a flowchart showing an initialization process. In the following description, an example of calculating the reference response by measuring the amplitude response while the headphones are worn five times is described.

First, the measurement signal generation unit 221 outputs a measurement signal to the headphones 43, and the signal analysis unit 223 acquires an amplitude response ECTF_0 in the state where the user U is not wearing the headphones 43 (S101). In other words, the measurement signal generation unit 221 generates a measurement signal (which is referred to also as a third measurement signal) in the state where the user U is not wearing the headphones 43. The measurement signal for initialization, which serves as the third measurement signal, may be an impulse signal or a TSP signal, just like the first and second measurement signals. Specifically, the measurement signal generation unit 221 generates the third measurement signal such that the same sound is output for a certain period of time from the headphones 43.

Each of the left microphone 2L and the right microphone 2R picks up the third measurement signal output from the headphones 43. The sound pickup signal acquisition unit 222 acquires sound pickup signals (which are referred to also as third sound pickup signals) that are respectively picked up by the left microphone 2L and the right microphone 2R when the third measurement signal is output. The signal analysis unit 223 performs FFT on the third sound pickup signals and thereby calculates a frequency-amplitude response. An amplitude response ECTF_0 while not wearing headphones is thereby acquired.

Then, n, which is a value (integer of 0 or more) indicating the number of times measurement is done while wearing headphones is initialized to n=0 (S102). The user U then puts on the headphones 43 (S103). For example, the user U puts on the headphones 43 when the display unit 231 displays the fact that acquisition of the amplitude response ECTF_0 while not wearing headphones is done.

The measurement signal generation unit 221 outputs a measurement signal to the headphones 43, and the signal analysis unit 223 acquires an amplitude response ECTF_i(n) in the state where the user U is wearing the headphones 43 (S104). The measurement signal generation unit 221 generates a measurement signal in the state where the user U is wearing the headphones 43. This measurement signal is the third measurement signal, and it may be an impulse signal or a TSP signal, just like the first and second measurement signals.

Each of the left microphone 2L and the right microphone 2R picks up the third measurement signal output from the headphones 43. The sound pickup signal acquisition unit 222 acquires sound pickup signals (which are referred to also as third sound pickup signals) that are respectively picked up by the left microphone 2L and the right microphone 2R when the third measurement signal is output. The signal analysis unit 223 performs FFT on the third sound pickup signals and thereby calculates a frequency response. An amplitude response ECTF_(n) while wearing headphones is thereby acquired. In this example, the signal analysis unit 223 calculates the amplitude response ECTF_i(n) at every frame.

Then, in order to detect that the user U has put on the headphones 43, the signal analysis unit 223 determines whether the amplitude response ECTF_i(n) has changed or not (S105). When it is determined that the amplitude response ECTF_i(n) has not changed for a specified period of time (e.g., 3 seconds) or longer, it is detected that the user U has put on the headphones 43. The signal analysis unit 223 compares the amplitude response ECTF_i(n) in a plurality of frames corresponding to the specified period of time and calculates a change of the amplitude response ECTF_i(n) during the specified period of time. When a difference in the amplitude response ECTF_i(n) between a plurality of frames is a certain value or less, the signal analysis unit 223 determines that the amplitude response ECTF_i(n) has not changed for a specified period of time.

When it is determined that the amplitude response ECTF_i(n) has changed (No in S105), the process returns to S104. The amplitude response ECTF_i(n) is acquired until the amplitude response ECTF_i(n) stops changing.

Figure 6:
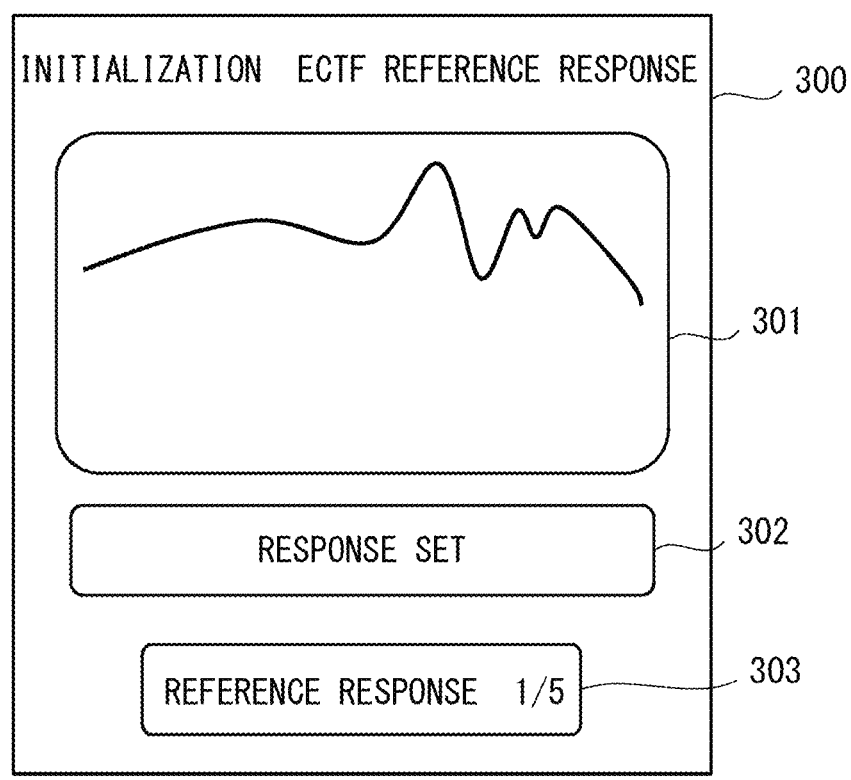
FIG. 6 is a view showing an example of a display screen in initialization.

When it is determined that the amplitude response ECTF_i(n) has not changed for a specified period of time or longer (Yes in S105), it is displayed that the n-th measurement is completed (S106). Then, the memory 211 stores the amplitude response ECTF_i(n). FIG. 6 shows an example of a display screen 300 showing the completion of the initial amplitude response ECTF_i(0). The display screen 300 contains a display field 301 of the amplitude response ECTF_i(0), a display field 302 of "response set", and a display field 303 of the number of measurements.

The amplitude response ECTF_i(0) displayed in the display field 301 may change from frame to frame. When it is determined in S105 that the amplitude response ECTF_i(n) has not changed for a specified period of time or longer, the display field 302 displays "reference set" which indicates the completion of acquisition of the amplitude response ECTF_i(0). The user U can thereby recognize that the initial measurement is completed. When, on the other hand, it is determined in S105 that the amplitude response ECTF_i(n) has changed, the display field 302 is blank. With the display field 302, the user U can immediately recognize that the n-th measurement is completed. Because it is the first of five measurements, the display field 303 displays "1/5".

Upon recognizing that the n-th measurement is completed, the user U puts off the headphones 43 (S107). Then, the signal processing device 201 detects the removal of the headphones 43 (S108). For example, it may be regarded that the headphones 43 are removed when the amplitude response is attenuated to the sound pressure level of the amplitude response ECTF_0 while not wearing headphones. The signal analysis unit 223 increments n (S109).

The signal analysis unit 223 determines whether n is a specified number of times (which is five in this example) or more (S110). When n is less than the specified number of times (No in S110), the processing from S103 is repeated. Specifically, the headphones 43 are put on again, and measurement is carried out in the same manner. Amplitude responses ECTF_i(1) to ECTF_i(4) are thereby sequentially measured.

When n becomes the specified number of times or more (Yes in S110), the reference value setting unit 225 sets a reference response ETCF_d (S111). For example, an amplitude response ECTF_iave, which is the average of the amplitude responses ECTF_i(1) to ECTF_i(4) stored in the memory 211, is set as the reference response ETCF_d to the reference value setting unit 225.

In this manner, the user U repeatedly puts on and off the headphones 43. The sound pickup signal acquisition unit 222 acquires the third sound pickup signals before and after the user U puts on the headphones. A plurality of amplitude responses ECTF_i(0) to ECTF_i(n) are thereby acquired. Specifically, after the amplitude response ECTF_i(0) is acquired, the headphones 43 are put on again, and then the amplitude response ECTF_i(1) is acquired. Each time putting on the headphones 43, the sound pickup signal acquisition unit 222 acquires the sound pickup signals, and thereby the plurality of amplitude responses ECTF_i(0) to ECTF_i(n) are acquired.

The reference response ETCF_d is set to the reference value setting unit 225 based on the plurality of amplitude responses ECTF_i(0) to ECTF_i(n). Further, a reference value based on the reference response ETCF_d is set to the reference value setting unit 225. The reference value, which is a response value of the reference response ETCF_d, is set based on the amplitude value of the reference response ETCF_d at 90 Hz to 1 kHz, for example.

Note that, although the reference response ETCF_d is acquired by measurement for initialization performed on the user U in the above-described embodiment, the reference response ETCF_d may be acquired by measurement for initialization performed on a listener different from the user U or a dummy head.

Figure 7:
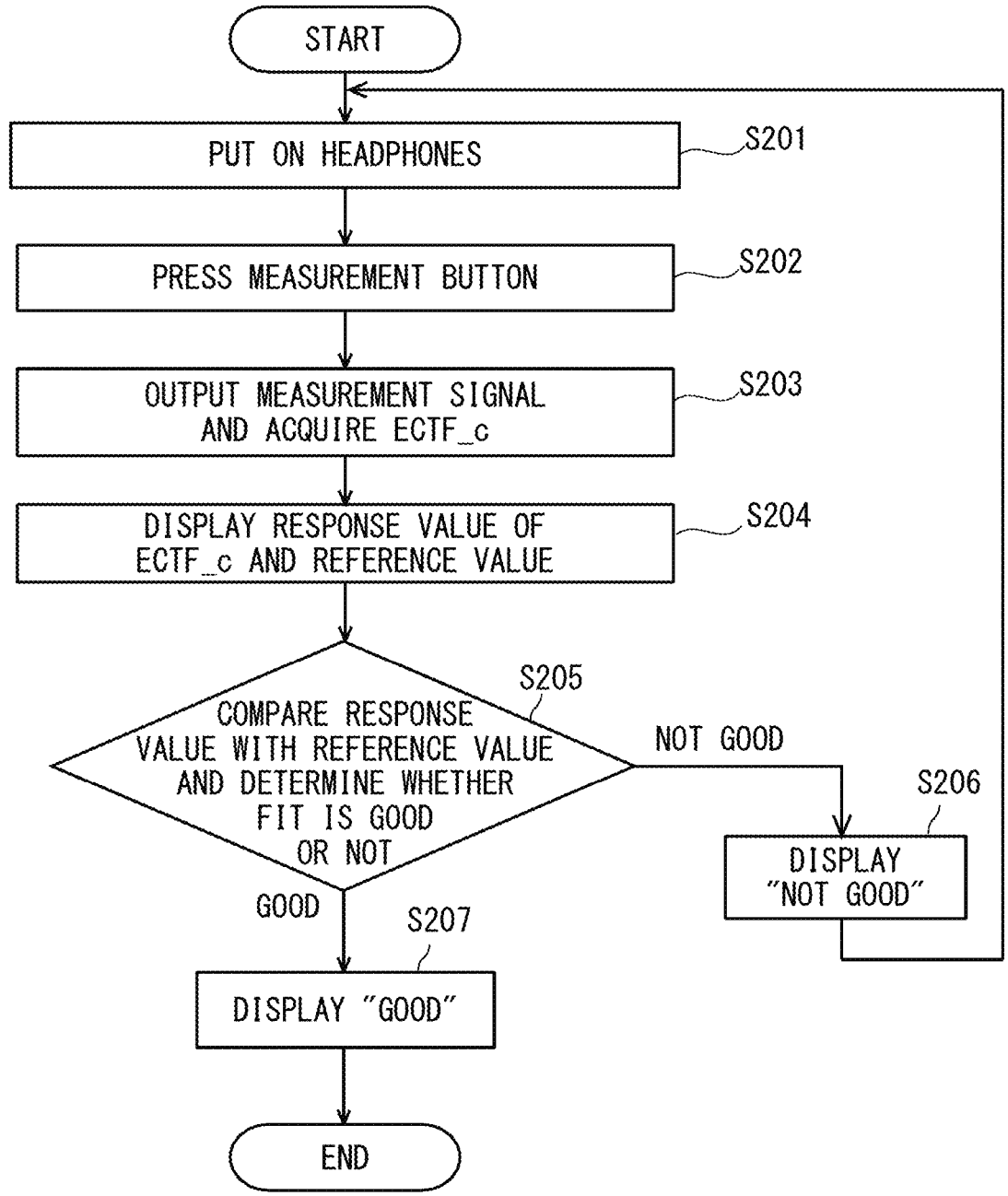
FIG. 7 is a flowchart showing a fit determination process.

Referring back to FIG. 4, after performing the initialization (S11), the fit determination unit 224 makes determination about the fit of the headphones 43 (S12). A detailed flow of determination on the fit of the headphones 43 is described hereinafter with reference to FIG. 7. A process for determining the fit is referred to also as calibration.

First, the user U puts on the headphones 43 (S201). The user U presses a measurement button by using the input operation unit 232 (S202).

Next, the measurement signal generation unit 221 outputs a measurement signal, and the signal analysis unit 223 acquires an amplitude response ECTF_c (S203). The measurement signal generation unit 221 generates a measurement signal in the state where the user U is wearing the headphones 43. A measurement signal for fit determination is a first measurement signal. Further, the first measurement signal for fit determination may be the same signal as the third measurement signal.

Each of the left microphone 2L and the right microphone 2R picks up the first measurement signal output from the headphones 43. The sound pickup signal acquisition unit 222 acquires sound pickup signals (which are referred to also as first sound pickup signals) that are respectively acquired by the left microphone 2L and the right microphone 2R when the first measurement signal is output. The signal analysis unit 223 performs FFT on the first sound pickup signals and thereby calculates a frequency response. An amplitude response ECTF_c for calibration is thereby acquired. In this example, the signal analysis unit 223 calculates the amplitude response ECTF_c at every frame.

The display unit 231 displays the response value of the amplitude response ECTF_c and the reference value (S204). Display of a calibration screen by the display unit 231 is described later.

The fit determination unit 224 compares the response value of the amplitude response ECTF_c with the reference value and determines whether the fit is good or not (S205). For example, when the response value of the amplitude response ECTF_c exceeds the reference value of the reference response ECTF_d for a specified period of time (e.g., 3 seconds) or longer, the fit determination unit 224 determines that the fit is good. Specifically, when the response value exceeds the reference value over a plurality of frames that continue for a specified period of time, the fit is determined to be good. When time during which the response value of the amplitude response ECTF_c exceeds the reference value of the reference response ECTF_d does not continue for a specified period of time or longer, the fit determination unit 224 determines that the fit is not good.

When the fit is determined to be not good ("No Good" in S205), the display unit 231 presents a display indicating "not good" (S206). Specifically, the display unit 231 displays a calibration screen showing that the fit is not good. Then, the processing from S201 is repeated. Specifically, the user U puts on the headphones 43 again, and calibration is carried out.

On the other hand, when the fit is determined to be good ("Good" in S205), the display unit 231 presents a display indicating "good" (S207). Specifically, the display unit 231 displays a calibration screen showing that the fit is good. It is preferred that the user U puts on the headphones 43 again and again and continues calibration until the fit is determined to be good.

Figure 8:
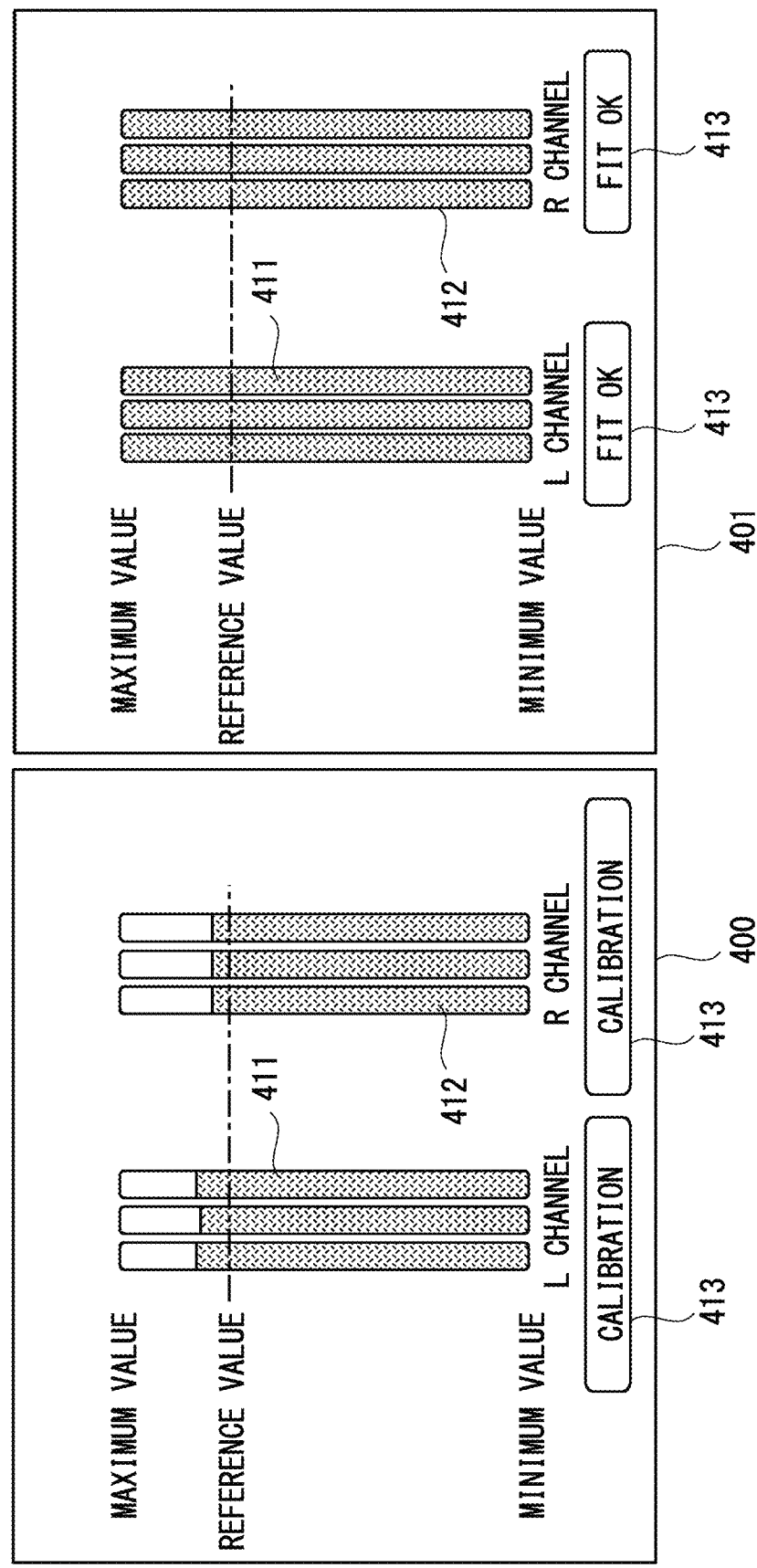
FIG. 8 is a view showing a calibration screen when a fit is good.
Figure 9:
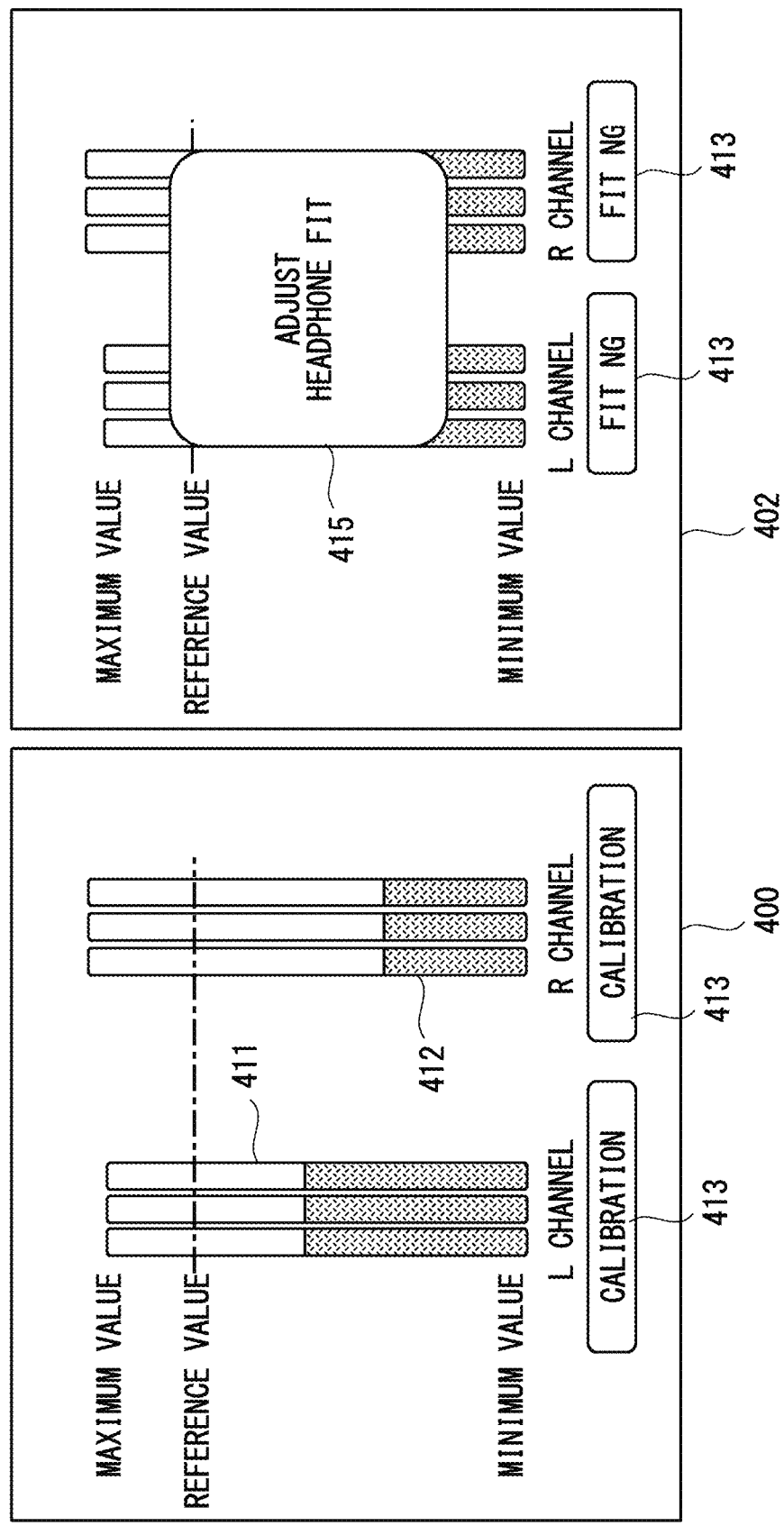
FIG. 9 is a view showing a calibration screen when a fit is not good.

FIGS. 8 and 9 show a display example of a calibration screen. FIGS. 8 and 9 are views showing a calibration screen. FIG. 8 shows a calibration screen 400 while determining the fit (during calibration) and a calibration screen 401 when the fit is determined to be good. FIG. 9 shows a calibration screen 400 while determining the fit (during calibration) and a calibration screen 402 when the fit is determined to be not good. The calibration screen 400 is a display screen in S205. The calibration screen 401 is a display screen in S207. The calibration screen 402 is a display screen in S206.

The calibration screen 400 shows indicators 411 and 412 indicating response values. The indictor 411 indicates an Lch response value, and the indictor 412 indicates an Rch response value. In this example, three response values are set to each channel, and therefore three indicator bars are displayed in each of the indicators 411 and 412. The length of the indicator bars varies depending on the response value. The three indicator bars correspond to the amplitude values in different frequency bands, respectively. In the case where the response value is updated at each frame, the indicators 411 and 412 may update the display of the response values at each frame.

For example, the first indicator bar displays a first response value based on the amplitude value in a first frequency band. Likewise, the second indicator bar displays a second response value based on the amplitude value in a second frequency band, and the third indicator bar displays a third response value based on the amplitude value in a third frequency band.

Further, a reference value is shown by an alternate long and short dash line in the indicators 411 and 412. Like the case of the response value, three reference values are set to each channel. The indicators 411 and 412 display the percentage of the response value with respect to the reference value by each bar. In this example, 80% of the amplitude value in each frequency band of the reference response acquired by initialization is the reference value. The reference value is not limited to 80% of the amplitude value in each frequency band of the reference response, and it may be an arbitrary percentage or an arbitrary value. Further, in FIGS. 8 and 9, the display unit 231 displays the calibration screen 400 in such a way that the indicators 411 and 412 are the maximum when the response value matches the reference value in each frequency band. Note that the display unit 231 may display the calibration screen 400 in such a way that the maximum of the indicators 411 and 412 is the reference value. In this case, the indicators 411 and 412 reach the maximum upon exceeding the reference value. In each channel, the amplitude values of the reference response ETCF_d in the first to third frequency bands are set as first to third reference values, respectively. In this example, the reference values are displayed at the same position in the three indicator bars. Further, a status display field 413 in the calibration screen 400 indicates that it is during calibration.

When time during which the response value exceeds the reference value continues for a specified period of time (e.g., 3 seconds) or longer, the status display field 413 in the calibration screen 401 indicates "fit OK" as shown in FIG. 8. The user U can thereby recognize that the fit is good.

When time during which the response value exceeds the reference value does not continue for a specified period of time or longer within a specified measurement period (e.g., 10 seconds), the status display field 413 in the calibration screen 402 indicates "fit NG" as shown in FIG. 9. Further, a message that prompts the user to adjust the headphones 43 is displayed in a message display field 415. By this display of the message display field 415, the user U is encouraged to put on the headphones 43 again. The user U can thereby recognize that the fit is not good.

Note that, when time during which any one of the three Lch response values and the three Rch response values exceeds the reference value does not continue for a specified period of time or longer, the fit determination unit 224 determines that the fit is not good. Specifically, the fit determination unit 224 determines that the fit is good when time during which all of the six response values exceed the reference value continues for a specified period of time or longer. In this manner, by determining a fit based on a plurality of response values, it is possible to make more appropriate determination. For example, when the isolation is poor in one of the left unit 43L and the right unit 43R, it is appropriately determined as not good.

Referring back to FIG. 4, the measurement device 200 performs ECTF measurement (measurement of ear canal transfer characteristics) in a good fit. The signal processing device 201 acquires measurement data of the ear canal transfer characteristics of the user U. The user U, who is wearing the headphones 43 with a good fit, uses the input operation unit 232 and presses a measurement button of ear canal transfer characteristics. The measurement signal generation unit 221 generates a measurement signal. The measurement signal for ECTF measurement is a second measurement signal, and it may be an impulse signal or a TSP signal.

Each of the left microphone 2L and the right microphone 2R picks up the second measurement signal output from the headphones 43. The sound pickup signal acquisition unit 222 acquires sound pickup signals (which are referred to also as second sound pickup signals) that are respectively acquired by the left microphone 2L and the right microphone 2R when the second measurement signal is output. The sound pickup signal acquisition unit 222 may output the second measurement signals over a plurality of frames and perform synchronous addition. It is thereby possible to remove sudden noise, which enables measurement with a high S/N ratio. Then, the signal analysis unit 223 acquires measurement data of the left and right ear canal transfer characteristics. The signal analysis unit 223 cuts out the left and right channel measurement data at the same time with a specified filter length and calculates a filter factor. Based on this filter factor, the signal analysis unit 223 calculates an inverse filter that cancels out the headphone characteristics.

In this embodiment, the inverse filter can be generated based on the measurement data measured with the headphones 43 worn with a good fit. When the headphones 43 are not a good fit, the isolation decreases, and low-frequency sound comes out in some cases. When measurement is carried out without a good fit, measurement data can fluctuate. Further, it is difficult for the user U to objectively determine a fit. In this embodiment, it is possible to prevent low-frequency sound from being attenuated due to a fit condition of headphones. This reduces the fluctuation of characteristics caused by a fit condition of headphones. The out-of-head localization device 100 can thereby perform out-of-head localization with a good balance between left and right channels.

Then, the left-right comparison unit 226 compares Lch and Rch measurement data and makes error determination (S14). When a difference between the left and right channel measurement data is small, a comparison result between left and right is determined to be good (OK in S14), and the process ends. The memory 211 stores an inverse filter that cancels out the headphone characteristics, and then the process ends.

When a difference between the left and right channel measurement data is large (NG in S14), the result is erroneous, and the user U adjusts the left microphone 2L and the right microphone 2R (S15). Because measurement data is not likely to be acquired appropriately, the user U adjusts the position of the microphone unit 2. After adjusting the microphone position, the measurement device 200 repeats the processing from S11.

Note that comparison between the left and right channel measurement data may be made using a phase response or a power ratio. A comparison method using a phase response is described first.

The left-right comparison unit 226 calculates a phase difference between left and right channels based on the measurement data of the ear canal transfer characteristics. For example, the left-right comparison unit 226 calculates the phase difference based on a difference in arrival time between a direct sound that directly reaches the left microphone 2L from the left unit 43L and a direct sound that directly reaches the right microphone 2R from the right unit 43R. Note that the direct sound is a sound that reaches the left microphone 2L or the right microphone 2R from the left unit 43L or the right unit 43R without being reflected on the ear canal. The left-right comparison unit 226 calculates the arrival time of direct sounds from the rising edge of the measurement data in the time domain. The left-right comparison unit 226 can calculate a phase difference between left and right channels from a difference in the arrival time of the left and right direct sounds. When an input S/N is known in a certain way, the detection accuracy becomes higher.

Alternatively, a frequency band where the effect of individual characteristics on the frequency response of the ear canal transfer characteristics is small may be extracted by a bandpass filter, and a phase difference may be calculated by the correlated calculation of the extracted band. The phase difference is as follows.

phase difference=sound velocity*(the number of samples of time difference between left and right)/(sampling frequency)

When the phase difference is 5 cm or more, the left-right comparison unit 226 determines the result as erroneous. Thus, the microphone position is adjusted, and remeasurement is carried out.

A comparison method using a power ratio is described next. The left-right comparison unit 226 can calculate the segmental powers of the ear canal transfer characteristics. When the amplitude spectrums of the ear canal transfer characteristics are hpL and hpR, left and right channel segmental powers egP_L and segP_R can be calculated by the following equations (1) and (2).

$$segP\_L = \Sigma(hpL(n)*hpL(n)) \qquad (1)$$

$$segP\_R = \Sigma(hpR(n)*hpR(n)) \qquad (2)$$

n=0<file_size. When the ratio of the left and right channel segmental powers is twice or more, the left-right comparison unit 226 determines the result as erroneous. When, on the other hand, the ratio of the left and right channel segmental powers is less than twice, the left-right comparison unit 226 determines the result as not erroneous.

If segP_Rate=segP_L/segP_R, the result is determined as not erroneous when segP_Rate is 0.5 to 2. On the other hand, the result is determined as erroneous when segP_Rate is 0.5 or less, or 2 or more. When the result is determined as erroneous, the microphone position is adjusted, and remeasurement is carried out.

As described above, the left-right comparison unit 226 makes error determination of the microphone position by comparing the left and right channel ear canal transfer characteristics. When a difference in the left and right channel ear canal transfer characteristics is large, the result is determined as erroneous, and the display unit 231 presents a display that prompts the user to adjust the microphone position. It is thereby possible to generate an inverse filter based on the measurement data of the ear canal transfer characteristics measured at appropriate microphone position.

When the transfer characteristics with significantly low accuracy or the transfer characteristics with poor balance between left and right are acquired due to a microphone position, it is possible to prompt the user to adjust the microphone position and carry out remeasurement. This enables generation of an appropriate inverse filter, which improves the accuracy of out-of-head localization. Note that error determination may be performed using both of the phase response and the power ratio, or using either one of them.

A frequency band for obtaining a response value in the signal analysis unit 223 is described hereinafter. The inventor has found that a frequency band where the effect of individual characteristics on the frequency response of the ear canal transfer characteristics is small is 2 kHz to 3 kHz. Thus, even when the user U puts on the same headphones 43 again, a change in the amplitude value is small at 2 kHz to 3 kHz. Further, even when a plurality of different headphones 43 are used, a change in the amplitude value is small at 2 kHz to 3 kHz. On the other hand, in 90 Hz to 1 kHz, which is lower than 2 kHz to 3 kHz, a change in the amplitude value depending on a fit condition is large. Thus, it is desirable to determine a fit based on the amplitude response at 90 Hz to 1 kHz. The frequency band of 90 Hz to 1 kHz is divided into three: first to third frequency bands. An example of dividing the frequency band of 90 Hz to 1 kHz into three parts is described hereinafter.

Example 1 of Dividing Response Value

In the division example 1, the number of points of the FFT resolution at 90 Hz to 1 kHz is divided into three. An example in which the sampling frequency of sound pickup signals is Fs=48000 kHz and the sample length is 1024 samples is described hereinbelow.

The frequency Freq can be calculated from the following equation (3).

$$\text{Freq[Hz]}=(\text{FS[Hz]}/\text{sample\_length[sample]}*2)*\text{sample} \quad (3)$$

From the equation (3), the number of samples at 90 Hz is as follows.

$$\text{sample}=90/(48000/1024*2)=3.84\approx 4 \text{ (rounded to integer type)}$$

Likewise, the number of samples at 1 kHz is as follows.

$$\text{sample}=1000/(48000/1024*2)=42.6667\approx 43 \text{ (rounded to integer type)}$$

Accordingly, the number of samples of the frequency resolution at 90 Hz to 1 kHz is 43−4=39. 39 is divided by 3, and 13 samples are contained in each frequency band. The first frequency band contains 4 to 16 (=4+13−1) samples. Thus, the first frequency band is 93.75 Hz to 375 Hz. The second frequency band contains 17 to 29 (=17+13−1) samples. Thus, the second frequency band is 398.4375 Hz to 679.6875 Hz. The third frequency band contains 30 to 43 samples. Thus, the third frequency band is 703.125 Hz to 1007.8125 Hz. The average or the like of the amplitude values contained in each frequency band may be used as the response value and the reference value.

Example 2 of Dividing Response Value

In the division example 2, a frequency band corresponding to 90 Hz to 1 kHz is extracted among frequency bands (critical bands) of 24 bandpass filters constituting an auditory filter, and divided into three parts. Use of the Bark scale of critical bands allows a frequency band to be divided in such a way that the perception of a difference in sound volume caused by a difference in frequency is just like an auditory sensation.

The Bark scale corresponding to 90 Hz to 1 kHz is in the following range.

100, 200, 300, 400, 510, 630, 770, 920, 1080

This range is equally divided into three as follows.

100, 200, 300/400, 510, 630/770, 920, 1080

For a wider intermediate and low frequency resolution, it is divided as follows.

100, 200, 300, 400/510, 630/770/920, 1080

A method of dividing a frequency band for obtaining three response values is not limited to the above example. Further, the number of response values is not limited to three. The number of response values may be one or two, or four or more. A frequency band can be divided into the number of response values to be obtained. Furthermore, a frequency band for obtaining response values is not limited to 90 Hz to 1 kHz.

Display Example

Figure 10:
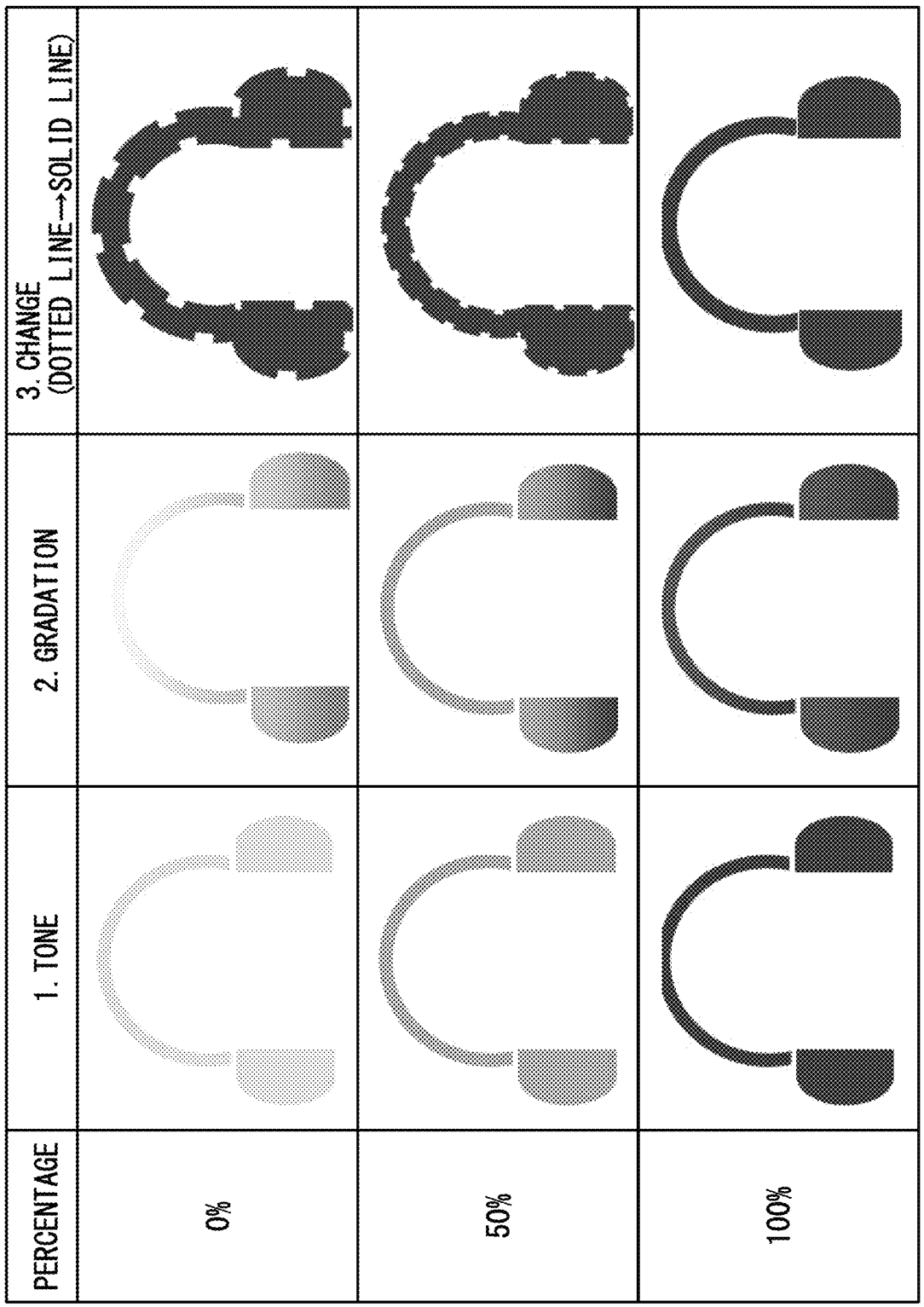
FIG. 10 is a view showing a display screen showing a fit.

FIG. 10 shows an example of changing display in accordance with the response value. FIG. 10 shows three display examples, and the display gradually changes in accordance with the percentage (which is also referred to as progress percentage) of the response value with respect to the reference value. To be specific, a display example 1 where a display tone changes, a display example 2 where a gradation changes, and an example 3 where an outline changes are shown. FIG. 10 schematically displays the figure of headphones as GUI. The response value increases as the progress percentage increases, and the response value matches the reference value when the progress percentage reaches 100%.

In the display example 1, as the progress percentage increases, the tone becomes darker. In the display example 2, as the progress percentage increases, the position at which the gradation begins in the illustration shifts upward. In the display example 3, when the progress percentage is small, the resolution of the outline (dotted line) of the illustration is low. As the progress percentage increases, the resolution of the outline becomes higher, and the illustration of headphones appears. When the progress percentage reaches 100%, the outline becomes a solid line.

By changing the display in this manner, the user U can visually recognize the progress percentage. The user U can thereby put on the headphones 43 appropriately and quickly. As a matter of course, a display example showing the progress percentage is not limited to the display examples 1 to 3 shown in FIG. 10, and the progress percentage may be shown by changing one or more of color, size, shape, thickness, shading and the like.

Further, by updating the display examples 1 to 3 of FIG. 10 in real-time, the user can recognize whether the adjustment of the headphones 43 is appropriate or not. Specifically, if the display is changing in such a way that the progress percentage approaches 100%, the user U can recognize that the headphones 43 are being adjusted in an appropriate direction. For example, when the sample length is 1024 samples and the sampling frequency is FS=48 kHz, one frame is (1024/48000) sec. Then, the progress percentage is calculated for each frame, and the display unit 231 updates the display at every frame. The user U can thereby intuitively recognize a change in the progress percentage.

A part or the whole of the above-described processing may be executed by a computer program. The above-described program can be stored and provided to the computer using any type of non-transitory computer readable medium. The non-transitory computer readable medium includes any type of tangible storage medium. Examples of the non-transitory computer readable medium include magnetic storage media (such as floppy disks, magnetic tapes, hard disk drives, etc.), optical magnetic storage media (e.g. magneto-optical disks), CD-ROM (Read Only Memory), CD-R, CD-R/W, and semiconductor memories (such as mask ROM, PROM (Programmable ROM), EPROM (Erasable PROM), flash ROM, RAM (Random Access Memory), etc.). The program may be provided to a computer using any type of transitory computer readable medium. Examples of the transitory computer readable medium include electric signals, optical signals, and electromagnetic waves. The transitory computer readable medium can provide the program to a computer via a wired communication line such as an electric wire or optical fiber or a wireless communication line.

Although embodiments of the invention made by the present invention are described in the foregoing, the present invention is not restricted to the above-described embodiments, and various changes and modifications may be made without departing from the scope of the invention.

The present disclosure is applicable to out-of-head localization technology.

What is claimed is:

1. A signal processing device comprising:
   a memory configured to store a processing program; and
   a center processing unit (CPU) coupled to the memory, the CPU configured to execute the program stored in the memory to:
   generate a first measurement signal and output the signal to headphones or earphones;
   acquire a first sound pickup signal obtained by picking up the first measurement signal by a microphone;
   calculate a frequency response of the first sound pickup signal;
   determine a fit of the headphones or earphones by comparing a response value of the frequency response in a specified frequency band with a reference value; and
   output gradual results of the determination in accordance with a percentage of the response value with respect to the reference value.

2. The signal processing device according to claim 1, wherein the CPU is further configured to:
   determine a fit is good in a case when the response value exceeds the reference value;
   generate a second measurement signal when the fit is determined to be good,
   acquire a second sound pickup signal obtained by picking up the second measurement signal by the microphone, and
   generate a filter for out-of-head localization by using the headphones or earphones based on the second sound pickup signal.

3. The signal processing device according to claim 1, wherein the CPU is further configured to:
   generate a third measurement signal, and
   acquire a third sound pickup signal obtained by picking up the third measurement signal by the microphone each time the headphones or earphones are put on again, and thereby acquires a plurality of third sound pickup signals,
   wherein the reference value is set based on the plurality of third sound pickup signals.

4. A signal processing method comprising:
   generating a first measurement signal and outputting the signal to headphones or earphones;
   acquiring a first sound pickup signal obtained by picking up the first measurement signal by a microphone;
   calculating a frequency response of the first sound pickup signal;
   determining a fit of the headphones or earphones by comparing a response value of the frequency response in a specified frequency band with a reference value; and
   outputting gradual results of the determination in accordance with a percentage of the response value with respect to the reference value.

5. A non-transitory computer readable medium storing a program causing a computer to execute:
   generating a first measurement signal and outputting the signal to headphones or earphones;
   acquiring a first sound pickup signal obtained by picking up the first measurement signal by a microphone;
   calculating a frequency response of the first sound pickup signal;
   determining a fit of the headphones or earphones by comparing a response value of the frequency response in a specified frequency band with a reference value; and
   outputting gradual results of the determination in accordance with a percentage of the response value with respect to the reference value.

\* \* \* \* \*